United States Patent
Liu et al.

(10) Patent No.: US 11,662,404 B2
(45) Date of Patent: May 30, 2023

(54) MAGNETIC RESONANCE SYSTEM AND TRANSMISSION APPARATUS, TRANSMISSION METHOD, AND PRE-SCANNING METHOD

(71) Applicant: GE Precision Healthcare LLC, Wauwatosa, WI (US)

(72) Inventors: Yu Liu, Beijing (CN); Xin Xie, Beijing (CN); Tingting Song, Beijing (CN); Kai Wang, Beijing (CN); Haoyang Xing, Beijing (CN); Dongliang Yang, Beijing (CN); Chunlai Xiao, Beijing (CN); Jianye Ning, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/731,002

(22) Filed: Apr. 27, 2022

(65) Prior Publication Data
US 2022/0365152 A1  Nov. 17, 2022

(30) Foreign Application Priority Data
May 11, 2021  (CN) .......................... 202110511876.2

(51) Int. Cl.
*G01R 33/36* (2006.01)

(52) U.S. Cl.
CPC ..... *G01R 33/3607* (2013.01); *G01R 33/3614* (2013.01)

(58) Field of Classification Search
CPC .................. G01R 33/3607; G01R 33/3614
See application file for complete search history.

(56) References Cited

U.S. PATENT DOCUMENTS

| 6,549,089 B2 | 4/2003 | Ashoka | |
| 8,760,165 B2 | 6/2014 | Xing | |
| 2011/0121829 A1* | 5/2011 | Umeda | G01R 33/3678 324/309 |

* cited by examiner

Primary Examiner — G. M. A. Hyder

(57) ABSTRACT

Embodiments of the present application provide a magnetic resonance system and a transmission apparatus, a transmission method, and a pre-scanning method. The apparatus includes: a signal output unit used to generate and output a pulse signal; a radio-frequency amplifier used to amplify the pulse signal; a signal processing unit used to transmit, to a transmit coil of the magnetic resonance system, the signal amplified by the radio-frequency amplifier, receive and adjust a phase of the feedback signal, and output the phase-adjusted feedback signal to the signal output unit; and a determination unit used to acquire amplitude values of the feedback signal at different phases, and determine a forward power and/or a reverse power according to the amplitude values of the feedback signal at the different phases.

14 Claims, 6 Drawing Sheets

| Directivity (dB) | VSWR | | | Return loss (dB) | | | Forward power error range (W) | | Reverse power error range (W) | |
|---|---|---|---|---|---|---|---|---|---|---|
| | Minimum | Actual value | Maximum | Minimum | Actual value | Maximum | | | | |
| 15 | 1.00 | 1.05 | 1.51 | $-\infty$ | -32.3 | -13.8 | -0.87% | 0.87% | -100% | 6722% |
| 20 | 1.00 | 1.05 | 1.28 | $-\infty$ | -32.3 | -18.1 | -0.50% | 0.50% | -100% | 2501% |
| 25 | 1.00 | 1.05 | 1.18 | $-\infty$ | -32.3 | -21.9 | -0.30% | 0.30% | -100% | 993% |
| 30 | 1.00 | 1.05 | 1.12 | $-\infty$ | -32.3 | -25.0 | -0.20% | 0.20% | -100% | 427% |
| 35 | 1.01 | 1.05 | 1.09 | -43.6 | -32.3 | -27.5 | -0.10% | 0.10% | -93% | 199% |
| 40 | 1.03 | 1.05 | 1.07 | -36.8 | -32.3 | -29.3 | 0% | 0% | -65% | 99% |
| 15 | 1.00 | 1.10 | 1.59 | $-\infty$ | -26.4 | -12.9 | -1.69% | 1.70% | -100% | 2141.00% |
| 20 | 1.00 | 1.10 | 1.35 | $-\infty$ | -26.4 | -16.6 | -1% | 1% | -100% | 861% |
| 25 | 1.00 | 1.10 | 1.23 | $-\infty$ | -26.4 | -19.6 | -0.50% | 0.50% | -100% | 376% |
| 30 | 1.03 | 1.10 | 1.17 | -35.9 | -26.4 | -22.0 | -0.30% | 0.30% | -89% | 177% |
| 35 | 1.06 | 1.10 | 1.14 | -30.5 | -26.4 | -23.7 | -0.20% | 0.20% | -61% | 89% |
| 40 | 1.08 | 1.10 | 1.12 | -28.5 | -26.4 | -24.8 | -0.10% | 0.10% | -38% | 46% |
| 15 | 1.00 | 1.20 | 1.75 | $-\infty$ | -20.8 | -11.3 | -3.21% | 3.26% | -100% | 774% |
| 20 | 1.00 | 1.20 | 1.48 | $-\infty$ | -20.8 | -14.3 | -1.80% | 1.80% | -100% | 341% |
| 25 | 1.07 | 1.20 | 1.35 | -29.2 | -20.8 | -16.6 | -1% | 1% | -85% | 162% |
| 30 | 1.13 | 1.20 | 1.28 | -25.6 | -20.8 | -18.2 | -0.60% | 0.60% | -57% | 82% |
| 35 | 1.16 | 1.20 | 1.24 | -22.7 | -20.8 | -19.3 | -0.30% | 0.30% | -35% | 43% |
| 40 | 1.18 | 1.20 | 1.22 | -21.8 | -20.8 | -19.9 | -0.20% | 0.20% | -21% | 23% |
| 15 | 1.00 | 1.30 | 1.92 | $-\infty$ | -17.7 | -10 | -4.59% | 4.69% | -100% | 459% |
| 20 | 1.06 | 1.30 | 1.61 | -30.4 | -17.7 | -12.6 | -2.60% | 2.60% | -95% | 212% |
| 25 | 1.16 | 1.30 | 1.46 | -22.7 | -17.7 | -14.5 | -1% | 1% | -68% | 105% |
| 30 | 1.22 | 1.30 | 1.39 | -20.1 | -17.7 | -15.8 | -0.60% | 0.60% | -57% | 82% |
| 35 | 1.25 | 1.30 | 1.35 | -19.0 | -17.7 | -16.6 | -0.30% | 0.30% | -35% | 43% |
| 40 | 1.27 | 1.30 | 1.33 | -18.4 | -17.7 | -17.0 | -0.20% | 0.20% | -21% | 23% |
| 15 | 1.00 | 1.40 | 2.10 | $-\infty$ | -15.6 | -9 | -5.84% | 6.02% | -100% | 327% |
| 20 | 1.14 | 1.40 | 1.74 | -23.7 | -15.6 | -11.3 | -3.40% | 3.40% | -84% | 156% |
| 25 | 1.25 | 1.40 | 1.58 | -19.2 | -15.6 | -13.0 | -1.90% | 1.90% | -56% | 79% |
| 30 | 1.31 | 1.40 | 1.50 | -17.4 | -15.6 | -14.0 | -1.10% | 1.10% | -34% | 42% |
| 35 | 1.35 | 1.40 | 1.45 | -16.6 | -15.6 | -14.7 | -0.60% | 0.60% | -20% | 22% |
| 40 | 1.37 | 1.40 | 1.43 | -16.1 | -15.6 | -15.0 | -0.30% | 0.30% | -12% | 12% |
| 15 | 1.04 | 1.50 | 2.29 | -33.4 | -14.0 | 8.1 | -7% | 7.24% | -98.77% | 257% |
| 20 | 1.22 | 1.50 | 1.88 | -20.2 | -14.0 | -10.3 | -4% | 4% | -75% | 125% |
| 25 | 1.33 | 1.50 | 1.70 | -16.9 | -14.0 | -11.7 | -2.20% | 2.30% | -48% | 64% |
| 30 | 1.40 | 1.50 | 1.61 | -15.5 | -14.0 | -12.6 | -1.30% | 1.30% | -29% | -34% |
| 35 | 1.44 | 1.50 | 1.56 | -14.8 | -14.0 | -13.2 | -0.70% | 0.70% | -17% | 19% |
| 40 | 1.47 | 1.50 | 1.53 | -14.4 | -14.0 | -13.5 | -0.40% | 0.40% | -10% | 10% |
| 15 | 1.17 | 1.70 | 2.69 | -22.2 | -11.7 | -6.8 | -9% | 9.40% | -90% | -184% |
| 20 | 1.37 | 1.70 | 2.17 | -16.2 | -11.7 | -8.7 | 5.10% | 5.30% | -62% | 92% |
| 25 | 1.50 | 1.70 | 1.94 | -14.0 | -11.7 | -9.9 | -2.90% | 2.90% | -39% | 48% |
| 30 | 1.58 | 1.70 | 1.83 | -12.9 | -11.7 | -10.7 | -1.60% | 1.60% | -23% | 26% |
| 35 | 1.63 | 1.70 | 1.77 | -12.4 | -11.7 | -11.1 | -0.90% | 0.90% | -13% | 14% |
| 40 | 1.66 | 1.70 | 1.74 | -12.1 | -11.7 | -11.4 | -0.50% | 0.50% | -8% | 8% |

FIG. 1

MAGNETIC RESONANCE SYSTEM AND TRANSMISSION APPARATUS, TRANSMISSION METHOD, AND PRE-SCANNING METHOD

CROSS REFERENCE

The present application claims priority and benefit of Chinese Patent Application No. 202110511876.2 filed on May 11, 2021, which is incorporated herein by reference in its entirety.

FIELD OF THE INVENTION

Embodiments of the present application relate to the technical field of medical devices, and relate in particular to a magnetic resonance system and a transmission apparatus, a transmission method, and a pre-scanning method.

BACKGROUND OF THE INVENTION

Magnetic resonance (MR) imaging systems are widely used in the field of medical diagnosis. A magnetic resonance system generally has a main magnet, a gradient radio-frequency amplifier, a gradient coil, a transmit chain module, a transmit/receive coil, a receive chain module, etc. The transmit chain module generates a pulse signal and transmits the same to the transmit/receive coil. The transmit/receive coil generates a radio-frequency excitation signal to excite a scanned object to generate a magnetic resonance signal. After the excitation, the transmit/receive coil receives the magnetic resonance signal, and a medical parameter image is reconstructed according to the magnetic resonance signal.

In a magnetic resonance transmit chain module, the forward power, reverse power, voltage standing wave ratio (VSWR), return loss, radio-frequency specific absorption rate (SAR), etc. are always important reference indicators of the transmit chain module. The voltage standing wave ratio can reflect a matching status of a radio-frequency load. The return loss indicates the ratio of a reflected power of a radio-frequency input signal to an input signal power, and can also reflect a matching status of a radio-frequency load. The SAR can indicate the rate at which a radio-frequency signal is absorbed by a scanned object. Currently, a coupler is widely used in various scenarios such as VSWR measurement, power monitoring, SAR measurement, etc.

BRIEF DESCRIPTION OF THE INVENTION

However, during measurement of the above indicators, an isolation degree of the coupler itself results in measurement errors, namely directivity errors. That is, the performance of the coupler has a significant impact on the accuracy of a measurement result. FIG. 1 is an exemplary chart showing relationships between the above indicators and the directivity magnitude of a coupler. As shown in FIG. 1, couplers having different directivities have a significant impact on the measurement result of each indicator. For example, when the actual VSWR is 1.4, if a coupler having a directivity of 15 dB is used, then a measured VSWR is in the range of 1-2.1 and has a large error, and the error of a measured reverse power is 300% or more, thereby resulting in a large error also in an SAR calculated by means of the reverse power, and accordingly causing SAR protection to be falsely triggered.

Currently, the directivity of a coupler is generally specified to be greater than 20 dB. However, even with a 20 dB directivity, the error of a measured reverse power is still 150% or more. Existing methods generally focus on designing a coupler having a higher directivity, that is, improving the performance of the coupler itself so as to improve the accuracy of measurement results. However, in the existing design methods, it is difficult to design a coupler having a directivity greater than 25-30 dB, especially for loose coupling in high radio-frequency power applications such as MR, etc.

Regarding at least one of the above technical problems, embodiments of the present application provide a magnetic resonance system and a transmission apparatus, a transmission method, and a pre-scanning method.

According to an aspect of the embodiments of the present application, a transmission apparatus of a magnetic resonance system is provided. The apparatus includes a signal output unit to generate and output a pulse signal and a radio-frequency amplifier for amplifying the pulse signal. The apparatus further includes a signal processing unit to transmit to a transmit coil of the magnetic resonance system, the signal amplified by the radio-frequency amplifier and receive and adjust a phase of a feedback signal. Thesignal processing unit further outputs the phase-adjusted feedback signal to the signal output unit. The apparatus further includes a determination unit to acquire amplitude values of the feedback signal at different phases, and determine a forward power and/or a reverse power according to the amplitude values of the feedback signal at the different phases.

Further, the signal processing unit comprises a coupler and a phase shifter. The signal amplified by the radio-frequency amplifier passes through the coupler and is then transmitted to the transmit coil of the magnetic resonance system, and after the feedback signal is acquired, the feedback signal is inputted into the phase shifter so as to adjust the phase of the feedback signal.

Further, the phase shifter continuously adjusts the phase of the feedback signal in the range of 0° to 360°. The feedback signal comprises at least one of a forward feedback signal and a reverse feedback signal.

Further, the determination unit acquires a maximum amplitude value and a minimum amplitude value of the forward feedback signal at different phases, and determines the forward power and/or the reverse power according to the maximum amplitude value, the minimum amplitude value, and a coupling factor and an isolation factor of the coupler. The amplitude values are voltage amplitude values.

Further, the determination unit calculates return loss and/or a standing wave ratio and/or a specific absorption rate according to the forward power and the reverse power.

According to an aspect of the embodiments of the present application, a magnetic resonance system is provided. The system includes a transmit coil; and the transmission apparatus according to the previous aspect.

According to an aspect of the embodiments of the present application, a transmission method for a magnetic resonance system is provided. The method includes a signal output unit for generating and outputting a pulse signal. A radio-frequency amplifier amplifies the pulse signal and a signal processing unit transmits, to a transmit coil of the magnetic resonance system, the signal amplified by the radio-frequency amplifier, and outputts a phase-adjusted feedback signal to the signal output unit. The signal processing unit adjusts a phase of a feedback signal, and a determination unit acquires amplitude values of the feedback signal at different phases and determines a forward power and/or a reverse power according to the amplitude values of the feedback signal at the different phases.

According to an aspect of the embodiments of the present application, a pre-scanning method for a magnetic resonance system is provided, the pre-scanning method includes performing central frequency searching for pre-scanning; and implementing the transmission method according to the previous aspect.

Further, the transmission method comprises acquiring a maximum amplitude value and a minimum amplitude value of the feedback signal at different phases, and determining the forward power and/or the reverse power according to the maximum amplitude value and the minimum amplitude value.

The pre-scanning method further comprises recording a first phase and a second phase corresponding to the maximum amplitude value and the minimum amplitude value; and adjusting scanning parameters for formal scanning according to the first phase and the second phase.

Further, the pre-scanning method comprises calculating a standing wave ratio according to the forward power and the reverse power; and stopping pre-scanning when the standing wave ratio is greater than a trip level.

According to another aspect of the embodiments of the present application, a storage medium having a computer-readable program stored therein is provided, wherein the computer-readable program enables a computer to implement, in a device, the method described above.

One of the beneficial effects of the embodiments of the present application is as follows: the phase of a feedback signal is adjusted to acquire amplitude values of the feedback signal at different phases, and an actual forward power and/or reverse power is determined according to the amplitude values of the feedback signal at the different phases so as to calculate indicators such as a standing wave ratio and/or a specific absorption rate, thereby achieving accurate calculation of the forward power and/or the reverse power, and accordingly improving the estimation accuracy of other indicators such as return loss and/or the standing wave ratio and/or the specific absorption rate. Therefore, automatic matching control can be implemented more accurately, and the risk of falsely triggering SAR protection is avoided, thereby protecting hardware of a transmit chain module and improving the performance of the transmit chain module. In addition, it is not necessary to design a coupler having a high directivity, thereby reducing implementation difficulties.

With reference to the following description and accompanying drawings, specific implementations of the embodiments of the present application are disclosed in detail, and manners in which the principle of the embodiments of the present application is employed are illustrated. It should be understood that the implementations of the present application are not thereby limited in scope. Within the spirit and scope of the appended claims, the implementations of the present application comprise various changes, modifications, and equivalents.

BRIEF DESCRIPTION OF THE DRAWINGS

The accompanying drawings are included to provide further understanding of embodiments of the present application, constitute a part of the specification, and are used to illustrate implementations of the present application and set forth the principles of the present application together with textual description. Obviously, the accompanying drawings in the following description are merely some embodiments of the present application, and a person of ordinary skill in the art could obtain other implementations according to the accompanying drawings without the exercise of inventive effort. In the accompanying drawings:

FIG. 1 is an exemplary chart showing relationships between indicators of an existing transmission system and the directivity magnitude of a coupler;

DETAILED DESCRIPTION

The foregoing and other features of the embodiments of the present application will become apparent from the following description with reference to the accompanying drawings. In the description and the accompanying drawings, specific implementations of the present application are specifically disclosed, and part of the implementations in which the principles of the embodiments of the present application may be employed are indicated. It should be understood that the present application is not limited to the described implementations. On the contrary, the embodiments of the present application include all modifications, variations, and equivalents falling within the scope of the appended claims.

In the embodiments of the present application, the terms "first," "second," etc. are used to differentiate different elements in terms of names, but do not indicate a spatial arrangement or temporal order, etc. of these elements, and these elements should not be limited by these terms. The term "and/or" includes any one of and all combinations of one or more associated listed terms. The terms "contain," "include," "have," etc. refer to the presence of stated features, elements, components, or assemblies, but do not exclude the presence or addition of one or more other features, elements, components, or assemblies.

In the embodiments of the present application, the singular forms "a", "the", etc. include plural forms, and should be broadly construed as "a type of" or "a class of" rather than limited to the meaning of "one". Furthermore, the term "the" should be construed as including both the singular and plural forms, unless otherwise specified in the context. In addition, the term "according to" should be understood as "at least partially according to," and the term "on the basis of" should be understood as "at least partially on the basis of," unless otherwise specified in the context.

The features described and/or illustrated for one implementation may be used in one or more other implementations in the same or similar manner, combined with features in other implementations, or replace features in other implementations. The term "include/comprise" when used herein refers to the presence of features, integrated components, steps, or assemblies, but does not preclude the presence or addition of one or more other features, integrated components, steps, or assemblies.

The embodiments of the present application are specifically described below.

Embodiments of First Aspect

Figure 2:
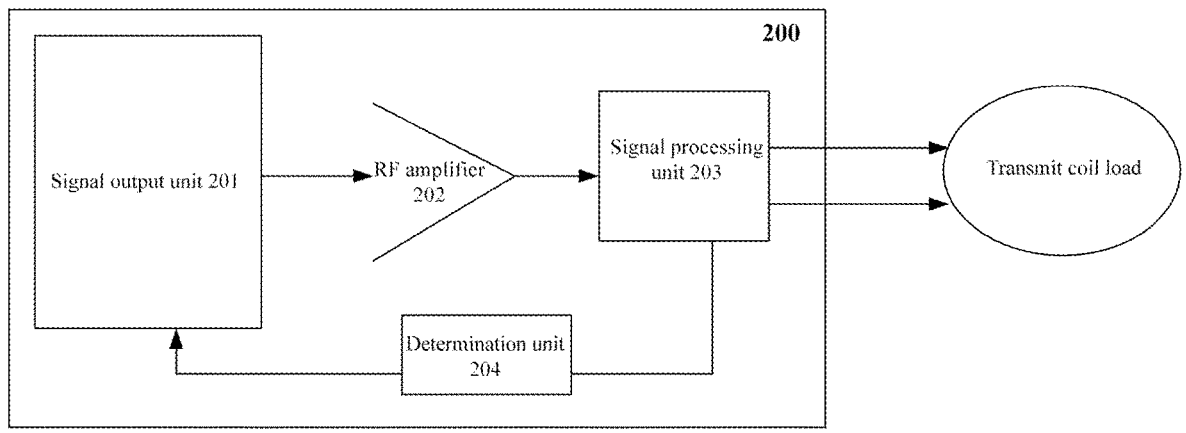
FIG. 2 is a schematic diagram of components of a transmission apparatus according to an embodiment of the present application.

An embodiment of the present application provides a transmission apparatus of a magnetic resonance system. FIG. 2 is a schematic diagram of the transmission apparatus of the magnetic resonance system according to the embodiment of the present application. As shown in FIG. 2, the apparatus 200 includes a signal output unit 201 used to generate and output a pulse signal and a radio-frequency amplifier 202 used to amplify the pulse signal. The apparatus further includes a signal processing unit 203 used to transmit, to a transmit coil of the magnetic resonance system, the signal amplified by the radio-frequency amplifier 202, receive and adjust a phase of a feedback signal, and output the phase-adjusted feedback signal to the signal output unit. The apparatus also includes a determination unit 204 used to acquire amplitude values of the feedback signal at different phases, and determine a forward power and/or a reverse power according to the amplitude values of the feedback signal at the different phases.

Figure 3:
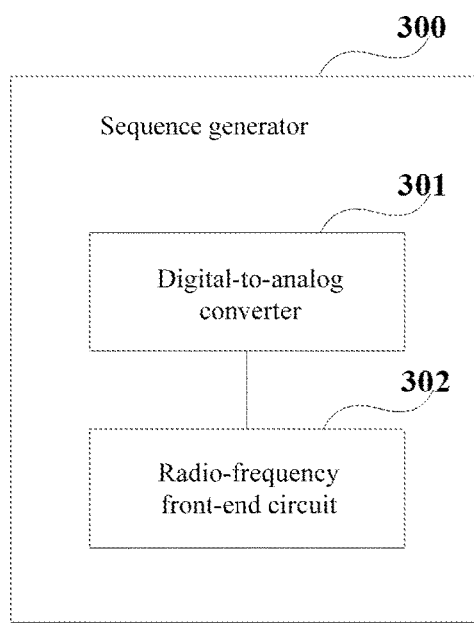
FIG. 3 is a schematic diagram of components of a signal output unit according to an embodiment of the present application.

In some embodiments, the signal output unit 201 may include a sequence generator 300. FIG. 3 is a schematic diagram of an implementation of the sequence generator. As shown in FIG. 3, the sequence generator includes a digital-to-analog converter 301 and a radio-frequency front-end circuit 302. The sequence generator generates, according to an instruction, a scanning sequence (including a radio-frequency pulse signal) required during MRI scanning. The pulse signal can generate a radio-frequency field used to excite a longitudinal magnetization vector of a scanned object to reverse so as to generate a transverse magnetization vector. The transverse magnetization vector decays in a spiral manner around an external magnetic field at a fixed angular frequency so as to generate a free induction decay signal. A magnetic resonance signal for imaging can be acquired according to the induction decay signal. The sequence generator generally generates a low-power radio-frequency pulse signal. The sequence generator is connected to the radio-frequency amplifier 202, and inputs the pulse signal into the radio-frequency amplifier 202. A type of the scanning sequence can be determined according to requirements, and the embodiments of the present application are not limited thereto. Optionally, the radio-frequency front-end circuit 302 may further include a transmission attenuator not shown in the figure, and used to control a degree of attenuation of the pulse signal before the pulse signal is inputted into the radio-frequency amplifier 202. For specific implementations of the above sequence generator, reference can be made to the prior art, and the present application are not limited thereto.

In some embodiments, the radio-frequency amplifier 202 is used to receive the low-power radio-frequency pulse signal outputted by the signal output unit 201, perform amplification processing, and then output an amplified radio-frequency pulse signal. The radio-frequency amplifier 202 can perform a series of processing, such as analog-to-digital or digital-to-analog conversion, modulation amplification, filtering processing, etc. on the received radio-frequency pulse signal, so as to output a high-power radio-frequency pulse signal, thereby meeting imaging requirements of the magnetic resonance imaging system. For the structure and type of the radio-frequency amplifier 202, reference can be made to the prior art, and examples are not enumerated herein.

In some embodiments, the signal processing unit 203 transmits, to a transmit coil of the magnetic resonance system, the signal amplified by the radio-frequency amplifier 202, and outputs a feedback signal to the signal output unit 201. Optionally, the signal processing unit 203 may include a transmit/receive mode switch not shown in the figure. The transmit/receive mode switch is controlled by the pulse signal from the sequence generator, so as to electrically connect the radio-frequency amplifier 202 to the transmit coil of the magnetic resonance system during a transmit mode. In addition, the signal processing unit 203 may also receive a part of reflected signals generated by the scanned object.

In some embodiments, the signal processing unit 203 outputs a feedback signal to the signal output unit 201. The feedback signal includes a forward feedback signal and/or a reverse feedback signal. The forward feedback signal refers to a feedback signal directly outputted by the signal processing unit 203, that is, a feedback signal at a front end of the transmit coil. The reverse feedback signal refers to a feedback signal returned from the transmit coil after the amplified radio-frequency pulse signal has reached the transmit coil, that is, a feedback signal at a rear end of the transmit coil.

Figure 4:
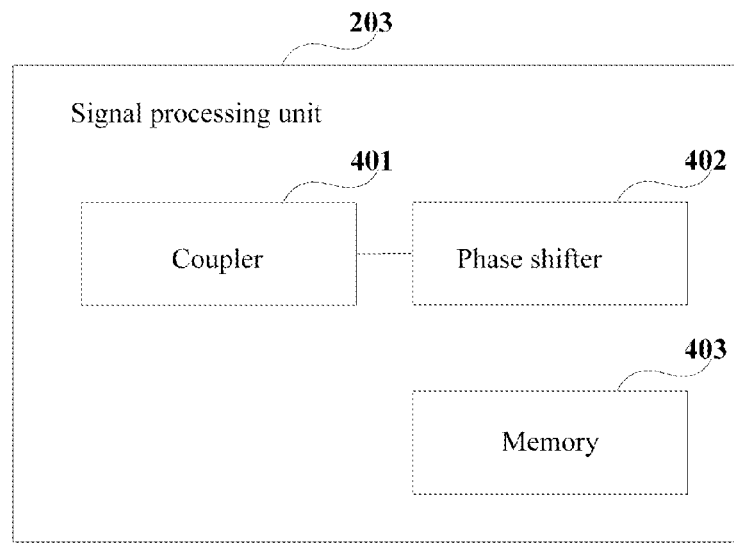
FIG. 4 is a schematic diagram of components of a signal processing unit according to an embodiment of the present application.

In some embodiments, FIG. 4 is a schematic diagram of components of the signal processing unit 203. As shown in FIG. 4, the signal processing unit 203 includes a coupler 401. During measurement of a high-power radio-frequency signal (the radio-frequency signal amplified by the amplifier), the coupler 401 can be used to separate, from a signal inputted from an input end, a small amount of a sampled signal, and send the same to a coupling end thereof, so as to use the separated signal to acquire a forward power, reverse power, voltage standing wave ratio (VSWR), return loss, radio-frequency specific absorption rate (SAR), and other indicators for measuring a transmit chain module. The signal amplified by the radio-frequency amplifier 202 passes through the coupler 401, and is then directly transmitted to the transmit coil of the magnetic resonance system.

In some embodiments, the signal processing unit 203 further includes a phase shifter 402. After the signal processing unit 203 acquires the reverse feedback signal, the reverse feedback signal is inputted into the phase shifter 402. The phase shifter 402 can adjust a phase of the reverse feedback signal, and the phase-adjusted reverse feedback signal passes through the coupler 401, and is outputted to the signal processing unit 203. The phase shifter 402 can continuously adjust the phase of the reverse feedback signal in the range of 0° to 360°. For implementations of the phase shifter 402, reference can be made to the prior art, and the embodiments of the present application are not limited thereto. For example, the phase shifter 402 may include a first phase shifter continuously adjustable in the range of 0° to 90°, a bridge, and two four-to-one switches. An output end of the first phase shifter is connected to an input end of the bridge, and an output end of the bridge is used as an output port of the phase shifter. The two four-to-one switches can be controlled to perform one of capacitor switching-on, inductor switching-on, circuit opening, and short circuiting. Therefore, a phase difference between the output end and the output/input end can be in four phase intervals: 0° to 90°, 90° to 180°, 180° to 270°, and 270° to 360°. That is, the phase difference between the input end and the output end can be any value between 0° and 360°. Therefore, the phase is continuously adjustable from 0° to 360°.

In some embodiments, the signal processor 203 may further include a memory 403. The memory 403 can store relevant performance parameters of the coupler 401, such as a coupling factor, an isolation factor, a directivity, and other indicators. The memory 403 may be an existing RAM, flash memory, removable medium, hard drive, ROM, EPROM, EEPROM, etc. The embodiments of the present application are not limited thereto.

In some embodiments, the coupler 401 can be a two-way directional coupler, and coupling directions thereof include a forward direction and a reverse direction. For example, the signal amplified by the radio-frequency amplifier 202 undergoes directional coupling in the forward direction and is then directly transmitted to the transmit coil of the magnetic resonance system, and the phase-adjusted feedback signal undergoes directional coupling in the reverse direction and is then outputted to the signal processing unit 203. However, the embodiments of the present application are not limited thereto. The coupler can also be made of a one-way directional coupler connected to the radio-frequency amplifier 202. The signal amplified by the radio-frequency amplifier 202 passes through the one-way directional coupler and is then directly transmitted to the transmit coil of the magnetic resonance system, and the phase-adjusted feedback signal passes through the one-way directional coupler and is then outputted to the signal processing unit 203. For implementations of the respective directional couplers described above, reference can be made to the prior art, and the embodiments of the present application are not limited thereto.

Figure 5:
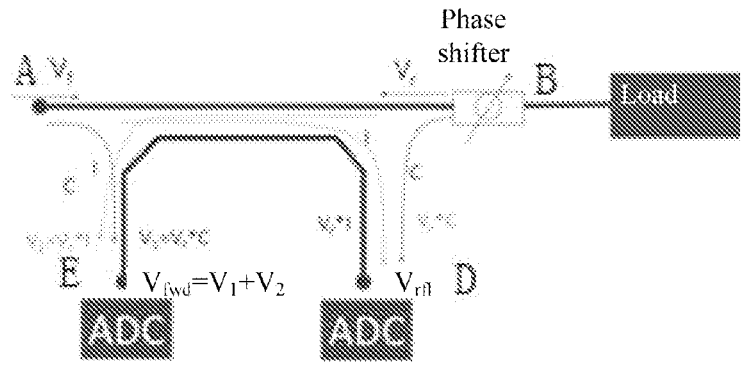
FIG. 5 is a schematic diagram of components of a coupler according to an embodiment of the present application.

FIG. 5 is a schematic diagram of the two-way directional coupler. As shown in FIG. 5, the coupler is a four-port element, and is composed of two-end transmission lines including a through line (primary line) and a coupling line (secondary line). Port A and port B are two ports of the through line, and are respectively a signal input end and a signal output end. Port E and port D are two ports of the coupling line. Port E is a forward coupling end, and port D is a reverse coupling end. That is, a signal outputted by port E is the aforementioned forward feedback signal, and a signal outputted by port D is the aforementioned reverse feedback signal. A signal F amplified by the radio-frequency amplifier 202 is inputted from port A. A part of the signal F is outputted by port B, and the other part of the signal F is coupled to port E. Ideally, port E is regarded as a coupling end, port D is regarded as an isolation end and should be completely isolated. However, due to the design of the coupler (affected by directivity indicators thereof), in an actual situation, a part of the signal leaks to port D. A phase-adjusted reverse feedback signal R is inputted from port B. A part of the signal is outputted by port A, and the other part of the signal is coupled to port D. Ideally, port D is regarded as a coupling end, port E is regarded as an isolation end and should be completely isolated. However, due to the design of the coupler (affected by directivity indicators thereof), in an actual situation, a part of the signal leaks to port E.

In some embodiments, at forward coupling port E, the outputted signal includes two superimposed signals. One signal is coupling signal E1 of the signal F, and the other signal is isolation signal E2 of the signal R. At reverse coupling port D, the output signal includes two superimposed signals. One signal is coupling signal D1 of signal R, and the other signal is isolation signal D2 of the signal F. As described above, ideally, forward coupling port E should include only C1 and exclude C2, and reverse coupling port D should include only D1 and exclude D2. Therefore, each of the forward feedback signal outputted by forward coupling port E and the reverse feedback signal outputted by reverse coupling port D has a certain error. If the forward power, reverse power, voltage standing wave ratio (VSWR), return loss, radio-frequency specific absorption rate (SAR), and other indicators are directly determined according to the feedback signals outputted by the ports, then the errors are also included.

In the embodiments of the present application, the phase of a feedback signal is adjusted to acquire amplitude values of the feedback signal at different phases, and an actual forward power and/or reverse power is determined according to the amplitude values of the feedback signal at the different phases so as to calculate indicators such as a standing wave ratio and/or a specific absorption rate, thereby achieving accurate calculation of the forward power and/or the reverse power, and accordingly improving the estimation accuracy of other indicators such as return loss and/or the standing wave ratio and/or the specific absorption rate.

The following specifically describes how to determine the forward power and/or the reverse power.

In some embodiments, the determination unit 204 can acquire amplitude values of the feedback signal at different phases, and according to the amplitude values of the feedback signal at the different phases. Since the phase shifter 402 can continuously adjust the phase of the reverse feedback signal in the range of 0° to 360°, the determination unit 204 can acquire a maximum amplitude value and a minimum amplitude value of the forward feedback signal at different phases, and determine the forward power and/or the reverse power according to the maximum amplitude value, the minimum amplitude value, and a coupling factor and an isolation factor of the coupler 401.

In some embodiments, a signal outputted by a coupling end of the coupler 401 is a radio-frequency signal, and thus can undergo detection and be converted into a voltage signal, and the voltage signal can be transmitted to an analog-to-digital conversion module ADC (not shown) in the determination unit 204 such that the received voltage signal is sampled, so as to acquire an amplitude value of the signal. The signal amplitude value can be a voltage amplitude value. As shown in FIG. 5, $V_1=V_f \times C$, $V_2=V_r \times I$, $V_{fwd}=V_1+V_2$, $V_4=V_f \times I$, $V_3=V_r \times C$, and $V_{rfl}=V_3+V_4$, where C represents the coupling factor of the coupler, I represents the isolation factor of the coupler, $V_f$ represents the actual forward power, $V_r$ represents the actual reverse power, $V_{fwd}$ represents a forward feedback signal voltage, and $V_{rfl}$ represents a reverse feedback signal voltage.

Figure 6:
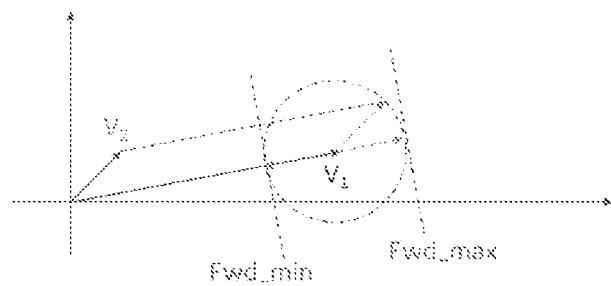
FIG. 6 is a schematic diagram showing changes in a voltage amplitude value of a forward feedback signal at different adjusted phases according to an embodiment of the present application.

FIG. 6 is a schematic diagram showing changes in a voltage amplitude value of the forward feedback signal at different adjusted phases according to an embodiment of the present application. As shown in FIG. 6, when $V_1$ and $V_2$ are in the same phase, the amplitude value of $V_{fwd}$ is the maximum, and when $V_1$ and $V_2$ are in opposite phases, the amplitude value of $V_{fwd}$ is the minimum. The maximum amplitude value and the minimum amplitude value can be expressed by following equations (1) and (2):

$$V_{fwd_{max}}=V_1+V_2 \qquad \text{Equation (1)}$$

$$V_{fwd_{min}}=V_1-V_2 \qquad \text{Equation (2)}$$

$V_1$ and $V_2$ can be acquired according to following equations (3) and (4):

$$V_1 = (V_{fwd_{max}} + V_{fwd_{min}})/2 \quad \text{Equation (3)}$$

$$V_2 = (V_{fwd_{max}} - V_{fwd_{min}})/2 \quad \text{Equation (4)}$$

In some embodiments, the determination unit 204 can read (the reading can be performed by a processor described below) the isolation factor I and the coupling factor C of the coupler from a memory of the signal processing unit 203, and can calculate the actual forward power and reverse power by means of following equations (5) and (6):

$$V_f = V_1/C \quad \text{Equation (5)}$$

$$V_r = V_2/I \quad \text{Equation (6)}$$

For example, after $V_f$ and $V_r$ is acquired, $V_f$ and $V_r$ can be converted, according to pre-stored correspondences between voltages and powers, into corresponding power values $P_f$ and $P_r$, where $P_f = V_f^2/2R$, $P_r = V_r^2/2R$ and R is a connected load. Alternatively, $V_f$ and $V_r$ may also be used as relative values of the forward power and the reverse power (this is because in some cases, only a relative relationship between the forward power and the reverse power needs to be considered, and respective absolute values of the forward power and the reverse power are not required). The embodiments of the present application are not limited thereto.

The above description explains how the forward power and/or the reverse power is determined by using the example in which the determination unit 204 acquires the maximum amplitude value and the minimum amplitude value of the forward feedback signal at different phases. The determination unit 204 can further acquire a maximum amplitude value and a minimum amplitude value of the reverse feedback signal at different phases to calculate $V_3$ and $V_4$, so as to calculate a forward power and/or reverse power. A calculation method thereof is similar to equations (1)-(6), and details thereof are not repeated herein.

In some embodiments, the determination unit 204 can further calculate return loss and/or a standing wave ratio and/or a specific absorption rate according to the forward power and the reverse power. For a specific calculation method, reference can be made to any existing method, and the embodiments of the present application are not limited thereto. For example, the return loss (RL) may be calculated by means of following equation (7), the standing wave ratio (VSWR) may be calculated by means of following equation (8), and the specific absorption rate (SAR) may be calculated by means of equation (9)-(10). However, the embodiments of the present application are not limited thereto.

$$RL = 10 \times \log\left(\frac{P_f}{P_r}\right) = 20 \times \log\left(\frac{V_f}{V_r}\right) \quad \text{Equation (7)}$$

$$VSWR = \left(\frac{10^{\frac{RL}{20}} + 1}{10^{\frac{RL}{20}} - 1}\right) \quad \text{Equation (8)}$$

$$SAR = P_f \times F = P_f \times \frac{J_{std}}{refl \times cableLoss \times (J_{std} + coilLoss)} \quad \text{Equation (9)}$$

where $J_{std}$ represents a molecular model (for example, a head model or a body part model), cableLoss and coilLoss represent cable loss and coil loss, is a reflection coefficient and is equal to $P_f/P_{net}$, and $P_{net}$ is a power for reaching the coil.

In some embodiments, in addition to including the analog-to-digital conversion module, the determination unit 204 may further include a processor for implementing calculation functions corresponding to the above equations (1)-(10). The processor may be implemented as a general-purpose processor, a digital signal processor (DSP), an application specific integrated circuit (ASIC), a field-programmable gate array (FPGA) or other programmable logic devices, discrete gate or transistor logic devices, a discrete hardware assembly, or any appropriate combination thereof for implementing the functions described in the present invention. The embodiments of the present application are not limited thereto.

In some embodiments, the determination unit 204 may be a separate modular component, or various components of the determination unit 204 may be disposed in the signal processing unit 203 and/or the signal output unit 201, or functions of the determination unit 204 may be integrated into the signal processing unit 203 and/or the signal output unit 201. However, the embodiments of the present application are not limited thereto. For example, functions of the processor of the determination unit 204 may be integrated into the signal processing unit 203 and/or a processor of the signal output unit 201, and examples are not enumerated herein.

For simplicity, FIG. 6 merely exemplarily shows a connection relationship or signal direction between the various components or modules. However, it should be clear to those skilled in the art that various related technologies such as bus connection can be used. The various components or modules can be implemented by means of a hardware facility such as a processor, a memory, etc. The embodiments of the present application are not limited thereto.

It should be noted that the transmission apparatus may further include components not shown in FIG. 2. For details, reference can be made to the related art, and details are not repeated herein.

The above embodiments merely provide illustrative description of the embodiments of the present application. However, the present application is not limited thereto, and appropriate variations may be made on the basis of the above embodiments. For example, each of the above embodiments may be used independently, or one or more of the above embodiments may be combined.

According to the above embodiments, the phase of a feedback signal is adjusted to acquire amplitude values of the feedback signal at different phases, and an actual forward power and/or reverse power is determined according to the amplitude values of the feedback signal at the different phases so as to calculate indicators such as a standing wave ratio and/or a specific absorption rate, thereby achieving accurate calculation of the forward power and/or the reverse power, and accordingly improving the estimation accuracy of other indicators such as return loss and/or the standing wave ratio and/or the specific absorption rate. Therefore, automatic matching control can be implemented more accurately, and the risk of falsely triggering SAR protection is avoided, thereby protecting hardware of a transmit chain module and improving the performance of the transmit chain module. In addition, it is not necessary to design a coupler having a high directivity, thereby reducing implementation difficulties.

Embodiments of Second Aspect

The embodiments of the present application provide a transmission method for a magnetic resonance system. The same content as that of the embodiments of the first aspect is not repeated herein.

Figure 7:
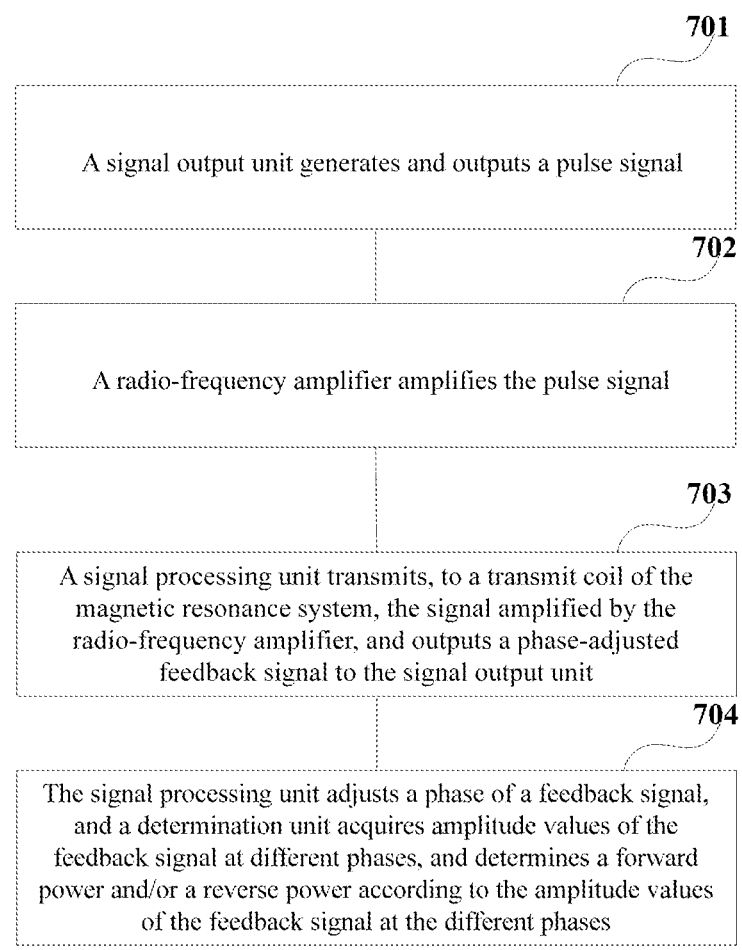
FIG. 7 is a schematic diagram of a transmission method according to an embodiment of the present application.

FIG. 7 is a schematic diagram of the transmission method for the magnetic resonance system according to an embodiment of the present application. As shown in FIG. 7, the transmission method for the magnetic resonance system includes at step 701, a signal output unit generating and outputting a pulse signal and at step 702, a radio-frequency amplifier amplifying the pulse signal. The system further includes at step 703, a signal processing unit transmitting, to a transmit coil of the magnetic resonance system, the signal amplified by the radio-frequency amplifier, and outputting a phase-adjusted feedback signal to the signal output unit. The system also includes at step 704, the signal processing unit adjusting a phase of a feedback signal, and a determination unit acquiring amplitude values of the feedback signal at different phases and determining a forward power and/or a reverse power according to the amplitude values of the feedback signal at the different phases.

In some embodiments, for implementations of 701-704 and implementations of the signal output unit, the radio-frequency amplifier, the signal processing unit, and the determination unit, reference may be made to the embodiments of the first aspect, and the same content is not repeated herein.

In some embodiments, the signal processing unit can continuously adjust the phase of the feedback signal in the range of 0° to 360°.

In some embodiments, the feedback signal includes a forward feedback signal and/or a reverse feedback signal.

In some embodiments, in 704, a maximum amplitude value and a minimum amplitude value of the forward feedback signal at different phases are acquired, and the forward power and/or the reverse power is determined according to the maximum amplitude value and the minimum amplitude value. The amplitude values are voltage amplitude values.

In some embodiments, the method may further include (not shown): calculating a standing wave ratio and/or a specific absorption rate according to the forward power and the reverse power.

It should be noted that FIG. 7 merely schematically illustrates the embodiments of the present application, but the present application is not limited thereto. For example, the execution order of the operations may be adjusted appropriately. In addition, some other operations may be added, or some of the operations may be skipped. Those skilled in the art could make appropriate variations according to the above disclosure, rather than being limited by the disclosure of FIG. 7.

The above embodiments merely provide illustrative description of the embodiments of the present application. However, the present application is not limited thereto, and appropriate variations may be made on the basis of the above embodiments. For example, each of the above embodiments may be used independently, or one or more of the above embodiments may be combined.

According to the above embodiments, the phase of a feedback signal is adjusted to acquire amplitude values of the feedback signal at different phases, and an actual forward power and/or reverse power is determined according to the amplitude values of the feedback signal at the different phases so as to calculate indicators such as a standing wave ratio and/or a specific absorption rate, thereby achieving accurate calculation of the forward power and/or the reverse power, and accordingly improving the estimation accuracy of other indicators such as return loss and/or the standing wave ratio and/or the specific absorption rate. Therefore, automatic matching control can be implemented more accurately, and the risk of falsely triggering SAR protection is avoided, thereby protecting hardware of a transmit chain module and improving the performance of the transmit chain module. In addition, it is not necessary to design a coupler having a high directivity, thereby reducing implementation difficulties.

Embodiments of Third Aspect

The embodiments of the present application further provide a magnetic resonance imaging system.

Figure 8:
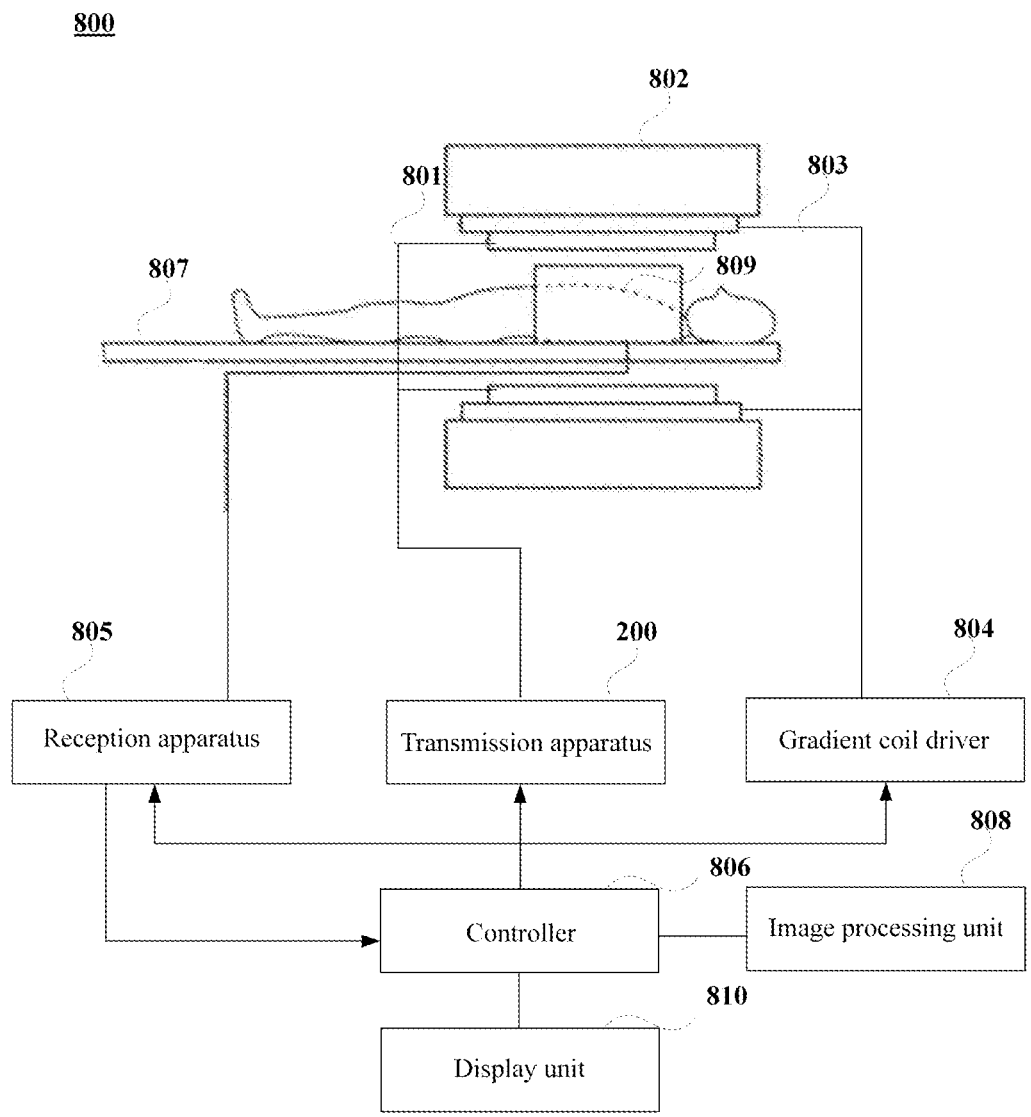
FIG. 8 is a schematic diagram of a magnetic resonance imaging system according to an embodiment of the present application.

FIG. 8 is a schematic diagram of components of the magnetic resonance imaging system. As shown in FIG. 8, the system 800 includes a transmit coil 801 and the transmission apparatus 200 according to the embodiments of the first aspect, and can be used to configure scanning parameters before the MRI system performs pre-scanning or formal scanning. The same content as that of the embodiments of the first aspect is not repeated herein.

In some embodiments, the magnetic resonance imaging system may further include a main magnet assembly 802, a gradient coil assembly 803, a gradient coil driver 804, a reception apparatus 805, a controller 806, a scanning table 807, an image processing unit 808, etc. For specific implementations, reference may be made to the related art, and the embodiments of the present application are not limited thereto.

In some implementations, the main magnet assembly 802 generally includes, for example, a superconducting magnet. A main magnet coil is arranged along the circumference of the superconducting magnet. The superconducting magnet is installed in an annular vacuum container, and defines a cylindrical imaging space surrounding an object to be scanned. A constant static magnetic field, such as a static magnetic field B0, is generated in a Z direction of the imaging space. The MRI system uses the formed static magnetic field B0 to transmit a magnetostatic pulse signal to the object accommodated in the imaging space, such that precession of protons in the body of the object to be scanned is ordered, and a longitudinal magnetization vector is generated.

In some implementations, the transmit coil 801 is generally arranged along an inner ring of the main magnet, and emits, in response to an RF excitation pulse emitted from the transmission apparatus 200, a radio-frequency field B1 orthogonal to the static magnetic field B0 to the object to be scanned 1016 so as to excite nuclei in the body of the object to be scanned 1016, such that the longitudinal magnetization vector is transformed into a transverse magnetization vector. For example, the controller 806 can instruct the signal output unit 201 to generate a scanning sequence, and generate an RF pulse signal. After being amplified by the RF amplifier 202, the signal is transmitted by the signal processing unit 203 to the RF transmit coil 801.

In some implementations, after the end of a radio-frequency excitation pulse, a free induction decay signal, namely a magnetic resonance signal that can be acquired, is generated in the process in which the transverse magnetization vector of the object to be scanned is gradually restored to zero.

In some implementations, the RF transmit coil 801 can be switched between a transmit mode and a receive mode by means of the transmit/receive mode switch in the signal processing unit 203. In the receive mode, the RF transmit coil 801 can be used to receive a magnetic resonance signal from the object to be scanned. The magnetic resonance signal can also be acquired by means of an RF receive coil 809 (optional) disposed adjacent to the object to be scanned.

In some embodiments, the controller 806 provides a gradient waveform to the gradient coil driver 804. The gradient coil driver 804 includes GX, GY and GZ amplifiers, etc. Each GX, GY, and GZ gradient amplifier excites a corresponding gradient coil in the gradient coil assembly 803 so as to generate a magnetic field gradient used to spatially encode an MR signal during MM scanning.

In some embodiments, the reception apparatus 805 is used to receive a magnetic resonance signal acquired by the receive coil 809 or the transmit coil 801 in the receive mode. The reception apparatus 805 may include an RF preamplifier, a phase detector, an analog/digital conversion module, etc. For details, reference may be made to the related art. The RF preamplifier is used to amplify the received magnetic resonance signal. The phase detector is used to perform phase detection on the amplified magnetic resonance signal. The analog/digital conversion module is used to convert the magnetic resonance signal that has undergone the phase detection from an analog signal to a digital signal, and then send the same to the image processing unit 808.

In some embodiments, the image processing unit 808 may perform operations such as preprocessing, reconstruction, etc. on the received digitized magnetic resonance signal, so as to acquire a required image or image data. The image processing unit 808 may include a processor and a storage medium. A program for predetermined data processing to be performed by the processor is recorded on the storage medium. The image processing unit 808 can be connected to the controller 806, and perform data processing on the basis of a control signal received from the controller 806. Optionally, the image processing unit 808 can be a separate apparatus connected to the MM system, or functions of the image processing unit 808 can be integrated into the controller 806. The embodiments of the present application are not limited thereto.

In some embodiments, the controller 806 may include a processor and a storage medium. The storage medium is used to store a program executable by the processor. When a computer executes the program, respective components of the MM system can perform corresponding operations so as to implement a scanning process for the object to be scanned. The scanning process may include pre-scanning and formal scanning following the pre-scanning.

For example, the controller 806 may control the MRI system to perform pre-scanning according to a predetermined pulse sequence. This may relate to, but is not limited to, controlling the amplitude, power, flip angle, frequency, etc. of an RF pulse signal emitted by the transmission apparatus 200, and may relate to, but is not limited to, controlling the power of a driving signal sent by the gradient coil driver 804, the density of a magnetic resonance signal acquired by the reception apparatus 805, etc.

Although it is described in the first embodiment that the determination unit 204 may be a separate modular component, or various components of the determination unit 204 may be disposed in the signal processing unit 203 and/or the signal output unit 201, or functions of the determination unit 204 may be integrated into the signal processing unit 203 and/or the signal output unit 201, the embodiments of the present application are not limited thereto. For example, functions of the processor of the determination unit 204 may be integrated into the signal processing unit 203 and/or the processor of the signal output unit 201. However, it can be understood that the functions of the determination unit 204 may also be implemented by means of the processor of the controller 806.

In some embodiments, the MRI system may further include a user input device (not shown), such as a keyboard and a mouse. An operator may input an operation signal with respect to the controller 806 by means of the user input device. For example, a user may send pre-configured scanning parameters, etc. to the controller 806 by means of the input device. In some embodiments, the MRI system may further include a display unit 810. The display unit can be connected to the input device to display an operation interface, and can also be connected to the image processing unit 808 to display an image. In addition, the storage media in the controller 806 and in the image processing unit 808 and the memory may include, for example, a ROM, a floppy disk, a hard disk, an optical disk, a magneto-optical disk, a CD-ROM, or a non-volatile memory card, and the like. The embodiments of the present application are not limited thereto.

In addition, the magnetic resonance imaging system 800 may further include components not shown in FIG. 8, such as a physiological acquisition controller, a scanned object positioning apparatus, etc. For details, reference can be made to the related art, and examples are not enumerated herein.

According to the above embodiments, the phase of a feedback signal is adjusted to acquire amplitude values of the feedback signal at different phases, and an actual forward power and/or reverse power is determined according to the amplitude values of the feedback signal at the different phases so as to calculate indicators such as a standing wave ratio and/or a specific absorption rate, thereby achieving accurate calculation of the forward power and/or the reverse power, and accordingly improving the estimation accuracy of other indicators such as return loss and/or the standing wave ratio and/or the specific absorption rate. Therefore, automatic matching control can be implemented more accurately, and the risk of falsely triggering SAR protection is avoided, thereby protecting hardware of a transmit chain module and improving the performance of the transmit chain module. In addition, it is not necessary to design a coupler having a high directivity, thereby reducing implementation difficulties.

Embodiments of Fourth Aspect

Figure 9:
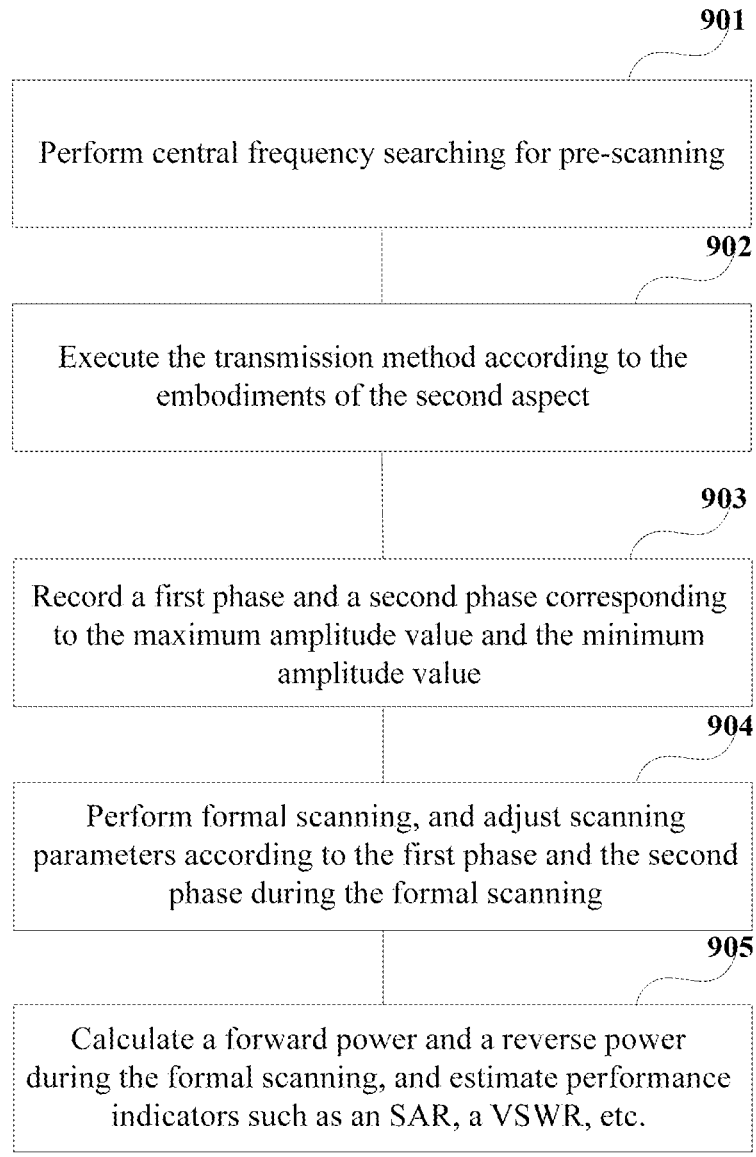
FIG. 9 is a schematic diagram of a pre-scanning method according to an embodiment of the present application.

The embodiments of the present application further provide a pre-scanning method for a magnetic resonance system. FIG. 9 is a schematic diagram of the pre-scanning method. As shown in FIG. 9, the method includes: at step 901, performing central frequency searching for pre-scanning; and at step 902, executing the transmission method according to the embodiments of the second aspect.

With reference to FIG. 8, in some embodiments, after the object to be scanned enters a scanning chamber (that is, the imaging space defined by the main magnet), scanning parameter configuration is performed. For example, the scanning parameter configuration can be performed using the input device on the basis of a part under detection. The scanning parameter configuration includes various conventional configurations of scanning parameters such as a scanning range, a scanning protocol, etc.

In 901, during a pre-scanning process, a central frequency needs to be corrected first so as to determine the optimal resonance frequency. The correction process includes central frequency searching (CFL) for determining a central frequency the same as a precession frequency of protons in the object to be scanned.

In 902, the signal output unit generates a group of pulse signals having the central frequency. The group of pulse signals are amplified by the RF amplifier and are then outputted to the signal processing unit. A feedback signal is received, and a phase of the feedback signal is adjusted. The feedback signal is outputted to the signal output unit, and amplitude values of the feedback signal at different phases are acquired. For example, a maximum amplitude value and a minimum amplitude value of the feedback signal at the different phases are acquired, and the forward power and/or the reverse power are determined according to the maximum amplitude value and the signal amplitude value.

In 902, the method further includes: calculating a standing wave ratio according to the forward power and the reverse power; and when the standing wave ratio is greater than a trip level, stopping pre-scanning and outputting alarm information, otherwise executing 903-905.

In some embodiments, the method may further include at step 903, recording a first phase and a second phase corresponding to the maximum amplitude value and the minimum amplitude value; and at step 904, performing formal scanning, and adjusting scanning parameters according to the first phase and the second phase during the formal scanning, the scanning parameters further including a phase of the phase shifter, that is, during the formal scanning, a phase adjusted by the phase shifter does not continuously changes in the range of 0° to 360° but is fixed at the first phase and the second phase. At step 905, calculating a forward power and a reverse power during the formal scanning, and estimating performance indicators such as the SAR, the VSWR, etc. For details, reference can be made to the prior art, and details are not repeated herein.

In some embodiments, if there is a next scanned object to be scanned, or a different part to be scanned, then the aforementioned pre-scanning method is implemented again.

The embodiments of the present application further provide a computer-readable program. When the program is executed in a transmission apparatus or an MRI system, the program enables a computer to implement, in the transmission apparatus or the MRI system, the method according to the embodiments of the second aspect or the fourth aspect.

The embodiments of the present application further provide a storage medium having a computer-readable program stored therein. The computer-readable program enables a computer to implement, in a transmission apparatus or an MRI system, the method according to the embodiments of the second aspect or the fourth aspect.

The above apparatus and method of the present application can be implemented by hardware, or can be implemented by hardware in combination with software. The present application relates to such a computer-readable program that the program, when executed by a logical component, enables the logical component to implement the foregoing apparatus or constituent components, or enables the logical component to implement the various methods or steps described above. The present application further relates to a storage medium for storing the above program, such as a hard disk, a magnetic disk, an optical disk, a DVD, a flash memory, etc.

The method/apparatus described with reference to the embodiments of the present application may be directly embodied as hardware, a software module executed by a processor, or a combination of the two. For example, one or more of the functional block diagrams and/or one or more combinations of the functional block diagrams shown in the drawings may correspond to either respective software modules or respective hardware modules of a computer program flow. The software modules may respectively correspond to the steps shown in the figures. The hardware modules, for example, may be implemented by firming the software modules by using a field programmable gate array (FPGA).

The software modules may be located in a RAM, a flash memory, a ROM, an EPROM, an EEPROM, a register, a hard disk, a floppy disk, a CD-ROM, or any storage medium in other forms known in the art. A storage medium may be coupled to a processor, so that the processor can read information from the storage medium and can write information into the storage medium. Alternatively, the storage medium may be a component of the processor. The processor and the storage medium may be located in an ASIC. The software module may be stored in a memory of a mobile terminal, and may also be stored in a memory card that can be inserted into a mobile terminal. For example, if a device (such as a mobile terminal) uses a large-capacity MEGA-SIM card or a large-capacity flash memory apparatus, the software module can be stored in the MEGA-SIM card or the large-capacity flash memory apparatus.

One or more of the functional blocks and/or one or more combinations of the functional blocks shown in the accompanying drawings may be implemented as a general-purpose processor, a digital signal processor (DSP), an application specific integrated circuit (ASIC), a field-programmable gate array (FPGA) or other programmable logic devices, discrete gate or transistor logic devices, a discrete hardware assembly, or any appropriate combination thereof for implementing the functions described in the present application. The one or more functional blocks and/or the one or more combinations of the functional blocks shown in the accompanying drawings may also be implemented as a combination of computing devices, such as a combination of a DSP and a microprocessor, multiple microprocessors, one or more microprocessors in communication combination with a DSP, or any other such configuration.

The present application is described above with reference to specific implementations. However, it should be clear to those skilled in the art that such description is merely illustrative and is not intended to limit the scope of protection of the present application. Various variations and modifications could be made by those skilled in the art according to the principle of the present application, and these variations and modifications also fall within the scope of the present application.

The invention claimed is:

1. A transmission apparatus of a magnetic resonance system comprises:
    a signal output unit used to generate and output a pulse signal;
    a radio-frequency amplifier used to amplify the pulse signal;
    a signal processing unit used to transmit, to a transmit coil of the magnetic resonance system, the signal amplified by the radio-frequency amplifier, receive and adjust a phase of the feedback signal, and output the phase-adjusted feedback signal to the signal output unit; and
    a determination unit used to acquire amplitude values of the feedback signal at different phases, and determine a forward power and/or a reverse power according to the amplitude values of the feedback signal at the different phases.

2. The apparatus according to claim 1, wherein the signal processing unit comprises a coupler and a phase shifter, the signal amplified by the radio-frequency amplifier passes through the coupler and is then transmitted to the transmit coil of the magnetic resonance system, and after the feedback signal is acquired, the feedback signal is inputted into the phase shifter so as to adjust the phase of the feedback signal.

3. The apparatus according to claim 2, wherein the phase shifter continuously adjusts the phase of the feedback signal in the range of 0° to 360°.

4. The apparatus according to claim 1, wherein the feedback signal comprises at least one of a forward feedback signal and a reverse feedback signal.

5. The apparatus according to claim 4, wherein the determination unit acquires a maximum amplitude value and a minimum amplitude value of the forward feedback signal at different phases, and determines the forward power and/or the reverse power according to the maximum amplitude value, the minimum amplitude value, and a coupling factor and an isolation factor of the coupler.

6. The apparatus according to claim 1, wherein the amplitude values are voltage amplitude values.

7. The apparatus according to claim 1, wherein the determination unit calculates return loss and/or a standing wave ratio and/or a specific absorption rate according to the forward power and the reverse power.

8. A magnetic resonance system, comprising:
a transmit coil; and
the transmission apparatus according to claim 1.

9. A transmission method for a magnetic resonance system, the method comprising:
generating and outputting a pulse signal via a signal output unit;
amplifying the pulse signal with a radio-frequency amplifier;
transmitting, to a transmit coil of the magnetic resonance system by a signal processing unit, the signal amplified by the radio-frequency amplifier, and outputting a phase-adjusted feedback signal to the signal output unit;
adjusting a phase of a feedback signal, and acquiring amplitude values of the feedback signal by a determination unit at different phases; and
determining a forward power and/or a reverse power according to the amplitude values of the feedback signal at the different phases.

10. A pre-scanning method for a magnetic resonance system, the pre-scanning method comprising:
performing central frequency searching for pre-scanning; and
implementing the transmission method according to claim 9.

11. The method according to claim 10, wherein the transmission method comprises:
acquiring a maximum amplitude value and a minimum amplitude value of the feedback signal at the different phases, and determining the forward power and/or the reverse power according to the maximum amplitude value and the minimum amplitude value.

12. The method according to claim 11, wherein the pre-scanning method further comprises:
recording a first phase and a second phase corresponding to the maximum amplitude value and the minimum amplitude value; and
adjusting scanning parameters for formal scanning according to the first phase and the second phase.

13. The method according to claim 11, wherein the pre-scanning method further comprises:
calculating a standing wave ratio according to the forward power and the reverse power; and
stopping pre-scanning when the standing wave ratio is greater than a trip level.

14. A storage medium having a computer-readable program stored therein, characterized in that the computer-readable program enables a computer to implement, in a device, the method according to claim 9.

* * * * *